United States Patent
Huang et al.

(10) Patent No.: US 10,526,200 B2
(45) Date of Patent: *Jan. 7, 2020

(54) SEMICONDUCTOR DEVICE PACKAGE INCLUDING COVER INCLUDING TILTED INNER SIDEWALL

(71) Applicant: Advanced Semiconductor Engineering, Inc., Kaohsiung (TW)

(72) Inventors: Ching-Han Huang, Kaohsiung (TW); Hsun-Wei Chan, Kaohsiung (TW); Yu-Hsuan Tsai, Kaohsiung (TW)

(73) Assignee: ADVANCED SEMICONDUCTOR ENGINEERING, INC., Kaosiung (TW)

(*) Notice: Subject to any disclaimer, the term of this patent is extended or adjusted under 35 U.S.C. 154(b) by 0 days.

This patent is subject to a terminal disclaimer.

(21) Appl. No.: 15/815,432

(22) Filed: Nov. 16, 2017

(65) Prior Publication Data
US 2018/0072563 A1 Mar. 15, 2018

Related U.S. Application Data

(63) Continuation of application No. 14/923,602, filed on Oct. 27, 2015, now Pat. No. 9,850,124.

(51) Int. Cl.
*H01L 31/0232* (2014.01)
*B81B 7/00* (2006.01)
(Continued)

(52) U.S. Cl.
CPC ........ *B81B 7/0067* (2013.01); *B81C 1/00317* (2013.01); *H01L 31/0203* (2013.01);
(Continued)

(58) Field of Classification Search
None
See application file for complete search history.

(56) References Cited

U.S. PATENT DOCUMENTS 5,458,716 A * 10/1995 Alfaro ............... H01L 21/50
156/245
7,285,834 B2 10/2007 Leib et al.
(Continued)

FOREIGN PATENT DOCUMENTS

CN 1545484 A 11/2004
CN 1587024 A 3/2005
(Continued)

OTHER PUBLICATIONS

Office Action for corresponding Chinese Patent Application No. 201610969440.7, dated Apr. 10, 2018, 5 pages.
(Continued)

*Primary Examiner* — Hung K Vu
(74) *Attorney, Agent, or Firm* — Foley & Lardner LLP; Cliff Z. Liu

(57) ABSTRACT

A semiconductor device package includes: (1) a carrier; (2) a sensor element disposed on or within the carrier; and (3) a cover including a top surface, a bottom surface and an inner sidewall, the inner sidewall defining a penetrating hole extending from the top surface to the bottom surface, and the penetrating hole exposing the sensor element. The semiconductor device package is characterized such that (i) the inner sidewall is divided into an upper portion and a lower portion, the upper portion is substantially perpendicular to the top surface, and the lower portion is tilted; or (ii) the entire inner sidewall is tilted. The lower portion of the inner sidewall or the entire inner sidewall is tilted at an angle of between about 10° to less than about 90°, relative to the top surface.

18 Claims, 6 Drawing Sheets

(51) Int. Cl.
*B81C 1/00* (2006.01)
*H01L 31/0203* (2014.01)

(52) U.S. Cl.
CPC ............... *B81B 2201/0292* (2013.01); *B81C 2203/0109* (2013.01)

(56) References Cited

U.S. PATENT DOCUMENTS

| | | | |
|---|---|---|---|
| 7,616,250 B2* | 11/2009 | Watanabe | H01L 27/14618 257/432 |
| 8,115,296 B2* | 2/2012 | Bolken | H01L 21/4803 257/692 |
| 2004/0214380 A1 | 10/2004 | Leib et al. | |
| 2011/0019282 A1* | 1/2011 | Lusinchi | G02B 13/001 359/619 |
| 2013/0181310 A1* | 7/2013 | Jun | H01L 27/14618 257/432 |
| 2014/0061841 A1 | 3/2014 | Kim et al. | |
| 2014/0176570 A1 | 6/2014 | Shi | |
| 2014/0246738 A1 | 9/2014 | Protheroe et al. | |
| 2015/0138424 A1 | 5/2015 | Dobashi | |
| 2015/0221623 A1* | 8/2015 | Tischler | H01L 25/165 257/89 |

FOREIGN PATENT DOCUMENTS

| | | |
|---|---|---|
| CN | 203259470 U | 10/2013 |
| CN | 104659045 A | 5/2015 |
| CN | 104871042 A | 8/2015 |
| KR | 10-2010-0012166 A | 2/2010 |
| KR | 2011-0092188 A | 8/2011 |
| TW | 200723551 A | 6/2007 |
| TW | M362434 U | 8/2009 |

OTHER PUBLICATIONS

Search Report for corresponding Chinese Patent Application No. 201610969440.7, issued with Office Action dated Apr. 10, 2018, 4 pages.
Non-Final Office Action for U.S. Appl. No. 14/923,602, dated Jan. 13, 2017.
Notice of Allowance for U.S. Appl. No. 14/923,602, dated Aug. 17, 2017.
Search Report from corresponding Taiwan Patent Application No. 105134860, dated Jul. 19, 2018, 2 pages.
Translation of Search Report from corresponding Taiwan Patent Application No. 105134860, dated Oct. 2, 2018, 2 pages.

* cited by examiner

SEMICONDUCTOR DEVICE PACKAGE INCLUDING COVER INCLUDING TILTED INNER SIDEWALL

CROSS-REFERENCE TO RELATED APPLICATION

This application is a continuation of U.S. patent application Ser. No. 14/923,602, filed Oct. 27, 2015, the content of which is incorporated herein by reference in its entirety.

BACKGROUND

1. Technical Field

The present disclosure relates to a semiconductor device package and a method of making the same, and more particularly, to a semiconductor device package having a micro-electro-mechanical systems (MEMS) device and a manufacturing method thereof.

2. Description of the Related Art

Packaging requirements for MEMS devices (such as MEMS dies) can be much more complex than traditional IC packaging requirements. An optical sensor package including a MEMS device is described by way of example. The optical sensor package should include an aperture to allow transmission of light to be detected, while reducing undesired parasitic light. Parasitic light refers to any of the incident light that may cause disturbance to the optical sensor. A MEMS die that allows the passage of light within a specific wavelength range through an aperture may be positioned on or within the optical sensor package adjacent to the aperture, such as on an outer surface of a lid of the MEMS device or on an inner surface of the lid.

When the MEMS die is placed on the inner surface of the lid, such as by pick-and-place, a relatively large distance between the aperture and a sidewall of the lid is needed, to avoid collision during the placement. Alternatively, a special apparatus can be used for placement, but the special apparatus increases manufacturing time and cost.

Additionally, undesired parasitic light may enter the package through an adhesive used to adhere the MEMS die to the lid. To enhance the sensitivity of the sensor, it is desired to reduce parasitic light detected by the sensor.

SUMMARY

In an aspect according to some embodiments, a semiconductor device package includes: (1) a carrier; (2) a sensor element disposed on or within the carrier; and (3) a cover including a top surface, a bottom surface and an inner sidewall, the inner sidewall defining a penetrating hole extending from the top surface to the bottom surface, and the penetrating hole exposing the sensor element. The semiconductor device package is characterized such that (i) the inner sidewall is divided into an upper portion and a lower portion, the upper portion is substantially perpendicular to the top surface, and the lower portion is tilted; or (ii) the entire inner sidewall is tilted. The lower portion of the inner sidewall or the entire inner sidewall is tilted at an angle of between about 10° to less than about 90°, relative to the top surface.

In another aspect according to some embodiments, a semiconductor device package includes: (1) a carrier; (2) a sensor element for receiving light disposed on the carrier or within the carrier; and (3) a cover including a top surface, a bottom surface and an inner sidewall, the inner sidewall defining a penetrating hole exposing the sensor element. A portion of the inner sidewall is tilted at an angle of between about 10° to less than about 90°, relative to the top surface.

Figure 1:
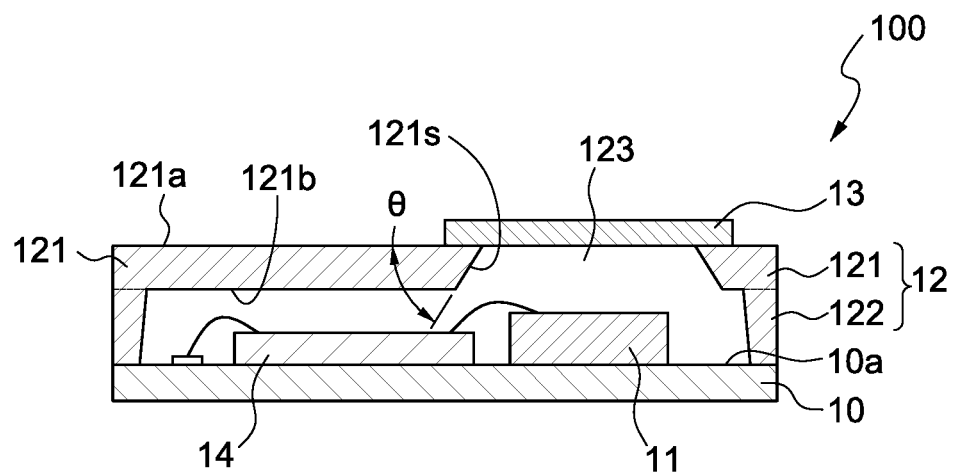
FIG. 1 illustrates a cross-sectional view of a semiconductor device package in accordance with an embodiment of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The present disclosure describes techniques suitable for the manufacture of smaller sensor device packages without the need of a special apparatus or special apparatuses. For embodiments of an optical sensor, the resulting sensor device packages can reduce parasitic light detected by the sensor, and thus enhance the sensitivity of the sensor.

FIG. 1 illustrates a cross-sectional view of a semiconductor device package 100 in accordance with an embodiment of the present disclosure. The semiconductor device package 100 includes a carrier 10, a sensor element 11, a cover 12 and a filter 13.

In one or more embodiments, the carrier 10 is a premolded leadframe including a die pad and leads. In one or more embodiments, the leadframe is, or includes, copper or a copper alloy. In other embodiments, the leadframe includes one of, or a combination of, iron, an iron alloy, nickel, a nickel alloy, or another metal or metal alloy. In one or more embodiments, the leadframe is coated with a silver or a copper layer.

In one or more embodiments, the carrier 10 is a substrate. The substrate is, for example, a printed circuit board (PCB), such as a paper-based copper foil laminate, a composite copper foil laminate, or a polymer-impregnated glass-fiber-based copper foil laminate. The substrate can include a core layer which is made of a bismaleimide-triazine (BT) resin or a glass-reinforced epoxy composite (e.g., an FR-4 composite).

In one or more embodiments, the carrier 10 is a semiconductor die. The semiconductor die may be, for example, an application-specific integrated circuit (ASIC) die.

In the embodiment illustrated in FIG. 1, the sensor element 11 (e.g., an infrared sensor) is disposed on a top surface 10a of the carrier 10 to sense or detect light passing through the filter 13. In other embodiments, the sensor element 11 is disposed within the carrier 10. The sensor element 11 is electrically connected (e.g., by wire bonding or flip chip bonding) to another device, such as to a processor 14 as shown in FIG. 1, or such as to an electrode (not shown) of the carrier 10 or other electronic device.

The cover 12 is positioned on the top surface 10a of the carrier 10. The cover 12 includes a base substrate 121 and a periphery barrier 122. The periphery barrier 122 is coupled to a bottom surface 121b of the base substrate 121, and contacts the top surface 10a of the carrier 10. The periphery barrier 122 may be integral with the base substrate 121 of the cover 12, or may be included as a separate component from the cover 12. The cover 12 and the carrier 10 together define a space to accommodate the sensor element 11 and protect the sensor element 11.

The base substrate 121 of the cover 12 has an inner sidewall 121s. The inner sidewall 121s of the base substrate 121 defines a penetrating hole 123 extending from a top surface 121a of the base substrate 121 to the bottom surface 121b of the base substrate 121.

In one or more embodiments, the cover 12 is, or includes, plastic. For example, the cover 12 may include a liquid crystal polymer, an epoxy resin, a polyphthalamide (PPA) resin, or a combination thereof. In such embodiments, the inner sidewall 121s, the top surface 121a and/or the bottom surface 121b of the base substrate 121 of the cover 12 may be coated with a reflective material for light reflection, and to prevent external light from entering the semiconductor device package 100 through the cover 12. In one or more embodiments, the reflective material is a metal coating; in other embodiments, the reflective material is another material.

In other embodiments, the cover 12 is, or includes, a metal for light reflection, and to prevent external light from entering the semiconductor device package 100 through the cover 12.

The metal used for the cover 12, or for the metal reflective material coated on the cover 12, can be stainless steel, aluminum (Al), gold (Au), silver (Ag), copper (Cu), nickel (Ni), or other metal, or can be a metal composite having a layered structure, such as stainless steel/Ni/Au, Ni/Ag, Ni/Au, stainless steel/Cu/stainless steel, and the like.

The filter 13 is disposed on the top surface 121a of the base substrate 121 and covers the penetrating hole 123. In one or more embodiments, depending on the intended application for the semiconductor device package 100, the filter 13 can be selected to allow light within a specific wavelength range to pass. In some embodiments, the sensor 11 is an infrared sensor, and the filter 13 allows infrared rays (e.g., near-infrared, middle-infrared or far-infrared rays) to pass, and may block light having other wavelengths. In one or more embodiments, the filter 13 allows infrared rays having a wavelength of about 5 μm or above to pass.

The filter 13 can be made of suitable materials, for example, silicon.

The filter 13 can be applied to the top surface 121a of the base substrate 121, for example, by a pick-and-place machine, and therefore the filter 13 (and the periphery barrier 122) would not be damaged during placement, as could be the case if the filter 13 were applied on the bottom surface 121b of the base substrate 121. Accordingly, a distance between the aperture and the inner sidewall can be decreased, without the need to accommodate a placement technique.

An adhesive (not shown) can be used to adhere the filter 13 to the cover 12.

To reduce or minimize undesired parasitic light from entering the package 100, such as from the edge of the filter 13 through the adhesive or by way of undesirable non-normal incident light (as described below), the inner sidewall 121s of the base substrate 121 is angled, as shown in FIG. 1. The benefits of this approach are discussed with respect to FIGS. 2A and 2B.

In some embodiments, the sensor element 11 is divided into several sensing areas for receiving light from a corresponding area of an external object, to identify the position or shape of the external object. In such embodiments, it is desirable that most of the received light is normal incident light (i.e., substantially perpendicular to a receiving area of the sensor element 11), because non-normal incident light may cause misjudgment of the sensor element 11. An example of non-normal incident light is when the light comes from the left side of the external object and is received by a sensing area located at the right side of the sensor element 11.

Figure 2A:
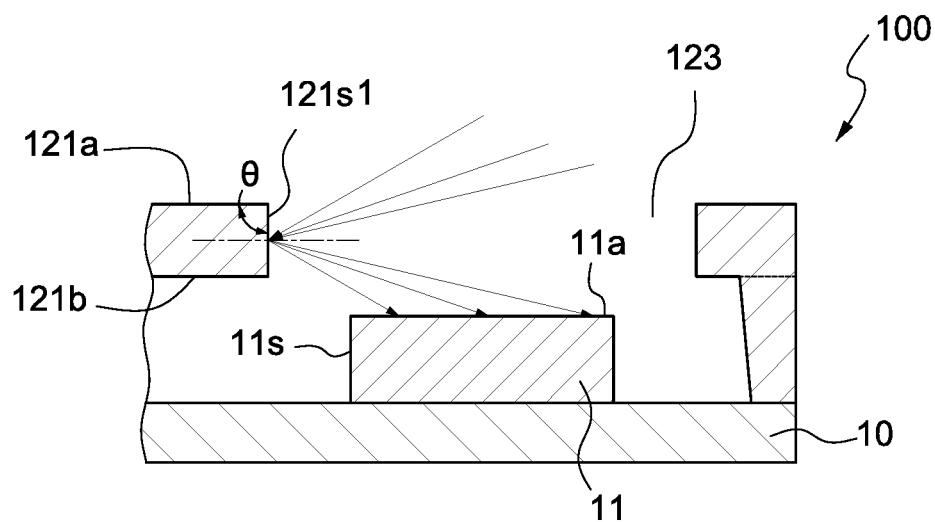
FIG. 2A illustrates reflection of undesired parasitic light.

FIG. 2A illustrates how the undesired parasitic light could affect the sensitivity of the sensor element 11 if an inner sidewall 121s1 were to be positioned perpendicularly to the top surface 121a of the base substrate 121. As shown in FIG. 2A, the undesired parasitic light enters from the right side of the package 100 and is received by the sensor element 11, after being reflected by the inner sidewall 121s1, thereby reducing the sensitivity of the sensor element 11.

According to the present disclosure, to reduce the undesired parasitic light, as shown in FIG. 1, the inner sidewall 121s is tilted at an angle (shown as θ in FIG. 1). The angle is less than about 90 degrees.

Figure 2B:
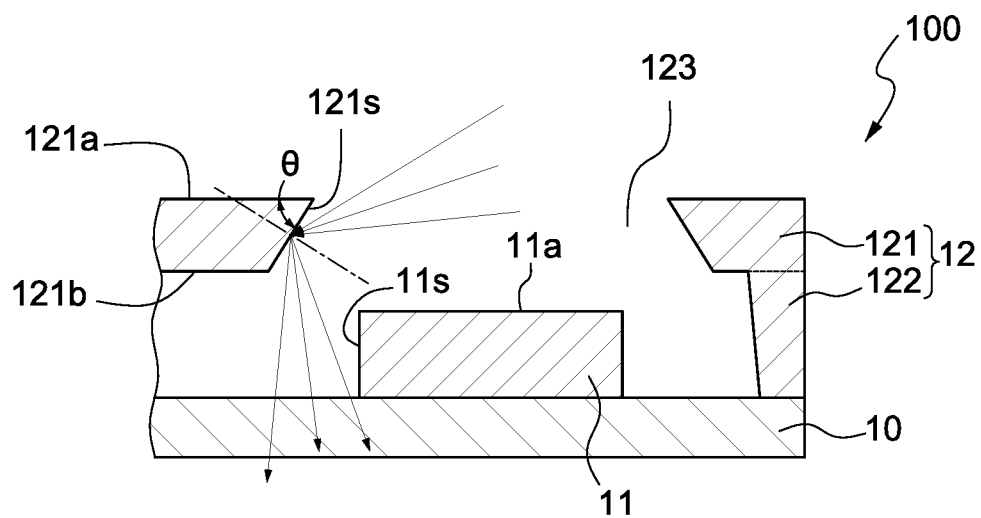
FIG. 2B illustrates reduced reflection of undesired parasitic light in accordance with an embodiment of the present disclosure.

FIG. 2B shows, for the semiconductor device package 100 of FIG. 1, the reflection of undesired parasitic light by the inner sidewall 121s tilted at an angle (shown as θ in FIG. 2B). The tilted inner sidewall 121s changes the path of the reflected light so the reflected light is directed away from the sensor element 11. The sensor element 11 in FIG. 2B receives less undesired parasitic light than the sensor element 11 in FIG. 2A, and thus has an improved sensitivity.

The titled angle (θ) may be adjusted or optimized in view of one or more of the following factors: a distance between the inner sidewall 121s and a nearest lateral surface 11s of the sensor element 11, a distance between the bottom surface 121b of the base substrate 121 and a top surface 11a of the sensor element 11, and a size of the penetrating hole 123. In one or more embodiments, the inner sidewall 121s of the base substrate 121 is tilted at an angle (θ) of between about 10° to less than about 90°, such as about 15° to about 80°, about 20° to about 70°, about 25° to about 65°, about 30° to about 60°, about 35° to about 55°, or about 40° to about 50°, relative to the top surface 121a of the base substrate 121. In one or more embodiments (e.g., as shown in FIG. 1), the inner sidewall 121s of the base substrate 121 is tilted at an angle of about 45°, such as about 42° to about 48°, relative to the top surface of the base substrate 121.

In one or more embodiments (e.g., as shown in FIG. 1), the whole of the inner sidewall 121s of the base substrate 121 is tilted. In other embodiments, a portion of the inner sidewall 121s is tilted at an angle, and a portion is not tilted.

Figure 3:
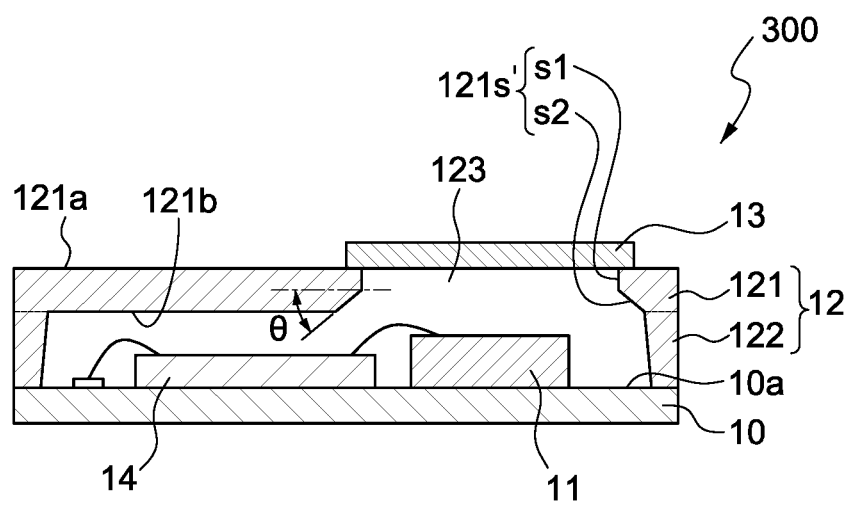
FIG. 3 illustrates a cross-sectional view of a semiconductor device package in accordance with an embodiment of the present disclosure.

FIG. 3 illustrates a cross-sectional view of a semiconductor device package 300 in accordance with an embodiment of the present disclosure. The semiconductor device package 300 is similar to the semiconductor device package 100 illustrated and described with respect to FIG. 1, except that a portion of an inner sidewall 121s' is substantially perpendicular to the top surface 121a of the base substrate 121, and a portion of the inner sidewall 121s' is tilted. In the embodiment of FIG. 3, the inner sidewall 121s' of the base substrate 121 has a perpendicular portion s1 and a tilted portion s2.

The tilted portion s2 is tilted at an angle (θ) of between about 10° to less than about 90°, such as about 15° to about 80°, about 20° to about 70°, about 25° to about 65°, about 30° to about 60°, about 35° to about 55°, or about 40° to about 50°, relative to the top surface 121a of the base substrate 121. In one or more embodiments (e.g., as shown in FIG. 3), the tilted portion s2 of the inner sidewall 121s' is tilted at an angle of about 45°, such as about 42° to about 48°, relative to the top surface of the base substrate 121. The tilted portion s2 can change a path of the undesired parasitic light and reduce the amount of the undesired parasitic light received by the sensor element 11.

The combination of a perpendicular portion s1 and a tilted portion s2 (as shown in FIG. 3) avoids a sharp edge between the inner sidewall 121s and the top surface 121a, as can occur in an embodiment in which the whole of the inner sidewall 121s of the base substrate 121 is tilted (e.g., as shown in FIG. 1). Such a sharp edge may be more susceptible to breakage during handling or manufacture. To further reduce a potential for breakage at edges of the base substrate 121, ones of the edges may be rounded. For example, one or more of the following edges may be rounded: the edge between the inner sidewall 121s or 121s' and the top surface 121a; an edge between the perpendicular portion s1 and the tilted portion s2; or an edge between the tilted portion s2 and the bottom surface 121b.

Figure 4:
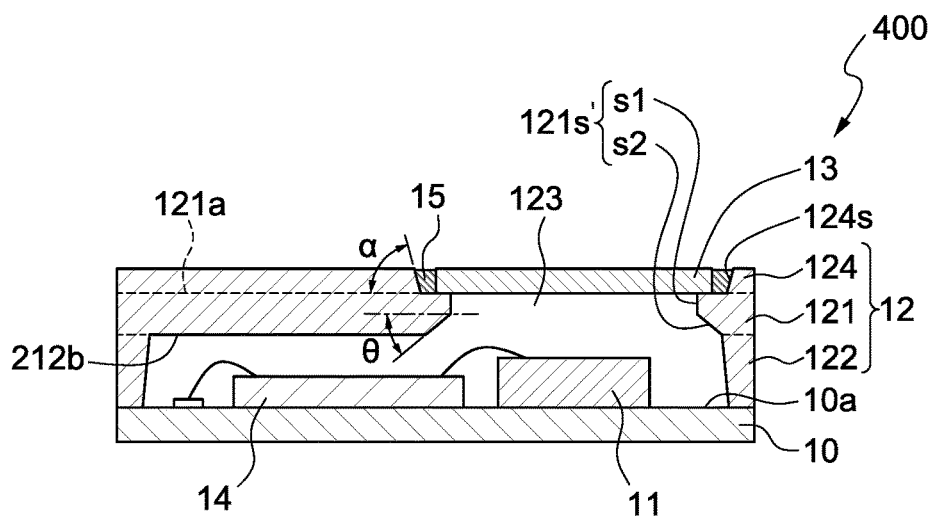
FIG. 4 illustrates a cross-sectional view of a semiconductor device package in accordance with an embodiment of the present disclosure.

FIG. 4 illustrates a cross-sectional view of a semiconductor device package 400 in accordance with an embodiment of the present disclosure. The semiconductor device package 400 is similar to the semiconductor device package 100 described with respect to FIG. 1, with the cover 12 including an inner sidewall 121s' having a perpendicular portion s1 and a tilted portion s2 as described with respect to FIG. 3, except that the cover 12 further includes a portion surrounding the filter 13.

The cover 12 includes a base substrate 121, a periphery barrier 122 and a portion 124 protruding from the top surface 121a of the base substrate 121. The protruding portion 124 may be integral with the base substrate 121 of the cover 12, or may be included as a separate component from the cover 12. Additionally, as described above with respect to FIG. 1, the periphery barrier 122 may be integral with the base substrate 121 of the cover 12, or may be included as a separate component from the cover 12. Accordingly, the cover 12 may include one, two, or three components (e.g., one integral component 121/122/124; one integral component 121/122 and one separate component 124; one integral component 121/124 and one separate component 122; or three separate components 121, 122, 124).

As described with respect to FIG. 1, the base substrate 121 of the cover 12 defines a penetrating hole 123 extending from a top surface 121a of the base substrate 121 to a bottom surface 121b of the base substrate 121. Specifically, in the embodiment shown in FIG. 4, the penetration hole 123 is defined by the inner sidewall 121s' of the base substrate 121.

The protruding portion 124 of the cover 12 has an inner sidewall 124s defining a space to accommodate the filter 13; therefore, it is easier to align the filter.

In one or more embodiments, the inner sidewall 124s of the protruding portion 124 is substantially perpendicular to the top surface 121a of the base substrate 121. In other embodiments, the inner sidewall 124s of the protruding portion 124 is tilted. For example, the inner sidewall 124s may be tilted at an angle (α) of between about 10° to less than about 90°, such as about 15° to about 80°, about 20° to about 70°, about 25° to about 65°, about 30° to about 60°, about 35° to about 55°, or about 40° to about 50°, relative to the top surface 121a of the base substrate 121. In one or more embodiments, the inner sidewall 124s of the protruding portion 124 is tilted at an angle of about 45°, such as about 42° to about 48°, relative to the top surface 121a of the base substrate 121. The titled inner sidewall 124s can reduce collision between the filter 13 and the protruding portion 124 during the placement of the filter 13.

A portion of the space defined by the inner sidewall 124s of the protruding portion 124 is filled with an adhesive 15 that adheres the filter 13 to the top surface 121a of the base substrate 121 and affixes the filter 13 in the space. The adhesive 15 may be any suitable adhesive. In an embodiment, the adhesive is a conductive adhesive. In an embodiment, the adhesive comprises a binder resin and conductive fillers. For example, the binder resin may be an epoxy resin, a polyimide, a polyacrylate, a polyurethane or a silicone resin, and the conductive fillers may be carbon black, metal (e.g., gold, silver, copper, aluminum, zinc, iron or nickel), metal-coated particles, a conductive compound, or combinations thereof. In one embodiment, the adhesive includes conductive fillers selected from carbon black, metal particles, metal-coated particles and a combination thereof. The adhesive may be selected to minimize undesired parasitic light from entering the package 400.

As described with respect to FIG. 1, the cover 12 may be plastic or metal, and the cover 12 may be coated with a reflective material. Refer to the description of FIG. 1 for details. As also described with respect to FIGS. 1 and 3, the base substrate 121 of the cover 12 may respectively have a tilted inner sidewall 121s, or an inner sidewall 121s' including a tilted portion s2. Refer to the respective descriptions of FIGS. 1 and 3 for details. The tilted inner sidewall 121s or tilted portion s2 of the inner sidewall 121s' can change the path of undesired parasitic light and reduce the amount of undesired parasitic light received by the sensor element 11 As noted, the filter 13 is attached to the top surface 121a of the base substrate 121 by the adhesive 15 filled in a portion of the space defined by the inner sidewall 124s of the protruding portion 124, and the filter 13 covers the penetrating hole 123. As compared to the embodiments shown in FIG. 1 and FIG. 3, the protruding portion 124 and the adhesive 15 filled in the space defined by the inner sidewall 124s of the protruding portion 124 can not only fix the position of the filter 13, but also protect the filter 13 from damage.

As described with respect to FIG. 1, in one or more embodiments, depending on the intended application for the semiconductor device package 400, the filter 13 can be selected to allow light within a specific wavelength range to pass. In one or more embodiments, the sensor 11 is an infrared sensor, and the filter 13 allows infrared rays (e.g., near-infrared, middle-infrared or far-infrared rays) to pass and may block the light having other wavelength.

The semiconductor device packages (e.g., as shown in FIGS. 1, 3 and 4) of the present disclosure can be applied to various MEMS devices, such as MEMS devices used for an infrared camera, a thermopile, a gesture sensor, or a proximity sensor. The techniques described in the present disclosure enhance the sensitivity of the sensor due to the design of the inner sidewall (e.g., 121s or 121s') defining the penetrating hole 123.

Figure 5A:
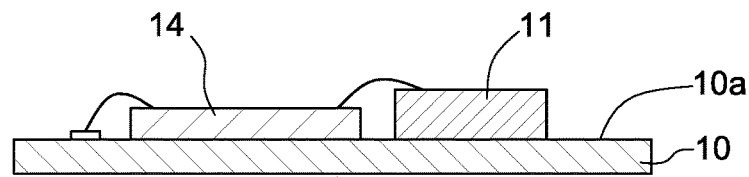
FIG. 5A, FIG. 5B and FIG. 5C illustrate a method of manufacturing a semiconductor device package in accordance with the embodiment shown in FIG. 3.
Figure 5B:
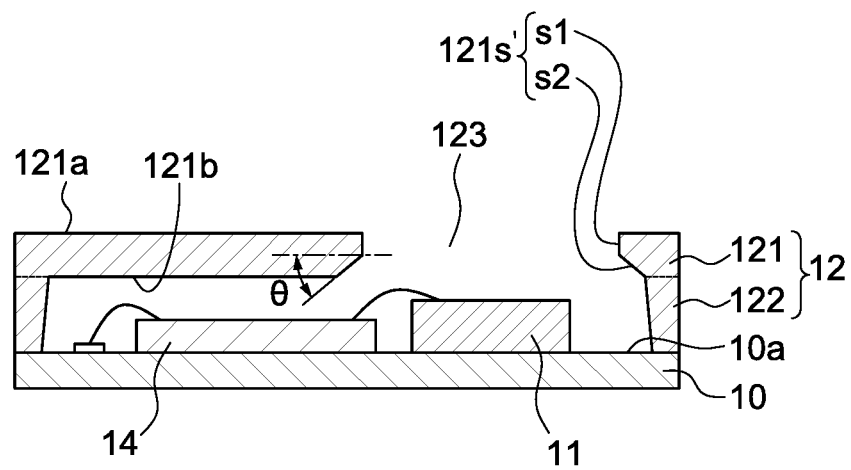
Figure 5C:
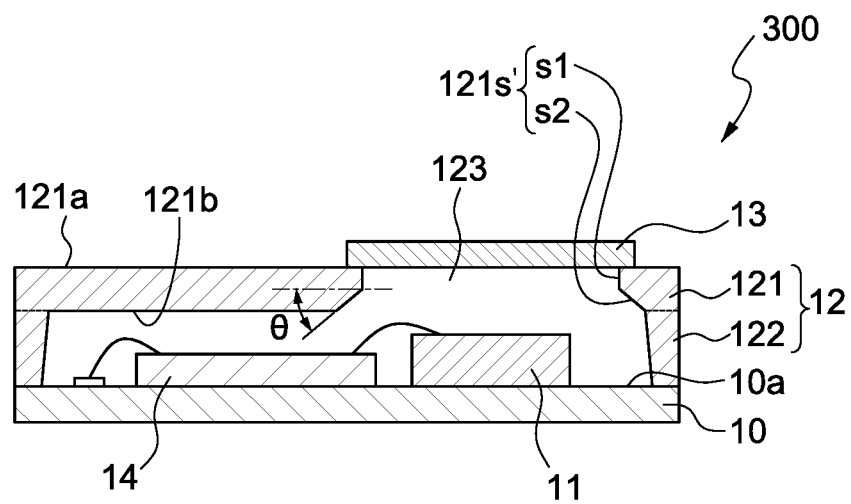

FIGS. 5A-5C illustrate a method of manufacturing a semiconductor device package 300 in accordance with the embodiment shown in FIG. 3. In FIG. 5A, a carrier 10 having a sensor element 11 disposed thereon or therein is provided. In FIG. 5B, a cover 12 is attached to the carrier. The cover 12 includes a base substrate 121 defining a penetrating hole 123, and further includes a periphery barrier 122. The cover 12 is positioned such that the periphery barrier 122 contacts a top surface 10a of the carrier. In FIG. 5C, a filter 13 is attached to a top surface 121a of the base substrate 121, for example, by an adhesive, and covers the penetrating hole 123.

The semiconductor device package 100 in accordance with the embodiment shown in FIG. 1 can be manufactured in a similar manner as described in FIGS. 5A-5C for the semiconductor device package 300.

Figure 6A:
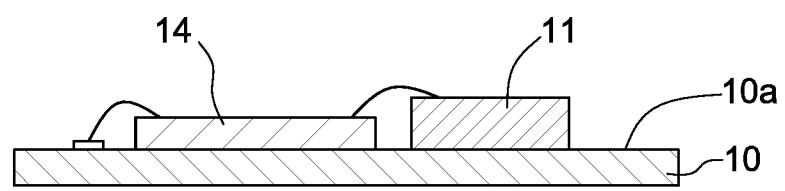
FIG. 6A, FIG. 6B and FIG. 6C illustrate a method of manufacturing a semiconductor device package in accordance with the embodiment shown in FIG. 4.
Figure 6B:
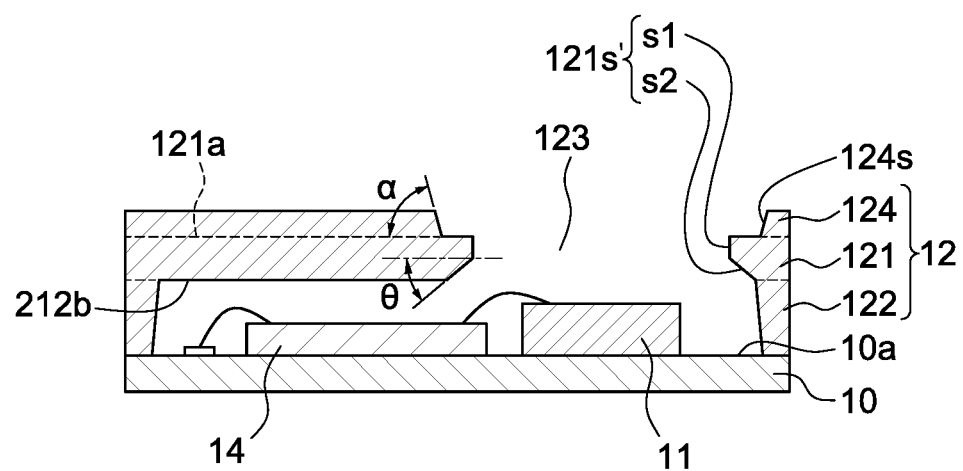
Figure 6C:
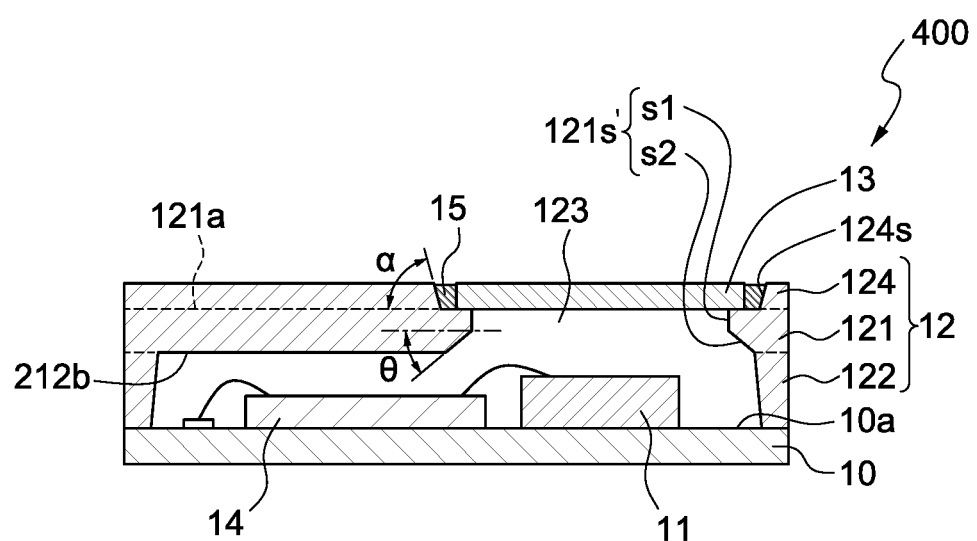

FIGS. 6A-6C illustrate a method of manufacturing a semiconductor device package 400 in accordance with the embodiment shown in FIG. 4. In FIG. 6A, a carrier 10 having a sensor element 11 disposed thereon or therein is provided. In FIG. 6B, a cover 12 is attached to the carrier 10. The cover 12 includes a base substrate 121 defining a penetrating hole 123, a periphery barrier 122, and a portion 124 protruding from a top surface 121a of the base substrate 121. The cover 12 is positioned such that the periphery barrier 122 contacts a top surface 10a of the carrier 10. In FIG. 6C, an adhesive 15 is applied to a space defined by an inner sidewall 124s of the protruding portion 124 of the cover 12, and a filter 13 is placed on the top surface 121a of the base substrate 121 to cover the penetrating hole 123, the filter 13 being adhered to the top surface 121a of the base substrate 121 by the adhesive 15. As can be seen in FIG. 6C (and FIG. 4), the inner sidewall 124s of the protruding portion 124 is set back from the inner sidewall 121s', leaving a shelf area on the top surface 121a of the base substrate 121 on which to apply the adhesive 15. By this technique, positioning of the adhesive may be better controlled.

The semiconductor device packages according to the present disclosure can be prepared using existing equipment, and the manufacture is cost-effective. For example, the cover 12 can be preformed, such as by molding (e.g., injection molding); and the filter 13 can be applied to the top surface 121a of the base substrate 121 of the cover 12, for example, by a pick-and-place machine already present in a semiconductor package plant, and damage to the filter 13 would be avoided during such placement.

The techniques described in the present disclosure result in improved sensor sensitivity.

As used herein, the terms "substantially" and "about" are used to denote small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. When used in conjunction with an event or circumstance, the terms "substantially" and "about" can refer to instances in which the event or circumstance occurs precisely, as well as instances in which the event or circumstance occurs to a close approximation. For example, "substantially perpendicular" can refer to a range of variation of less than or equal to ±10% of 90°, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
a carrier;
a sensor element disposed on or within the carrier, wherein the sensor element includes a receiving area for receiving light; and
a cover comprising a top surface, a bottom surface and an inner sidewall, the inner sidewall defining a penetrating hole extending from the top surface to the bottom surface, and the penetrating hole exposing the sensor element, wherein the inner sidewall includes a tilted inner sidewall tilted relative to the top surface, a dimension of a lower portion of the penetrating hole adjacent to the sensor element is larger than a dimension of an upper portion of the penetrating hole distal to the sensor element, the dimension of the upper portion of the penetrating hole is larger than a dimension of the receiving area of the sensor element, and the receiving area of the sensor element does not overlap the cover in a vertical projection direction,
wherein the cover is a plastic cover and the inner sidewall of the cover is coated with a reflective metal coating.

2. The semiconductor device package according to claim 1, wherein the tilted inner sidewall is tilted at an angle of between about 30° to about 60°, relative to the top surface.

3. The semiconductor device package according to claim 1, wherein the tilted inner sidewall is tilted at an angle of between about 40° to about 50°, relative to the top surface.

4. The semiconductor device package according to claim 1, further comprising a filter disposed on the cover and covering the penetrating hole.

5. The semiconductor device package according to claim 4, wherein the cover further comprises a portion protruding from the top surface, and the protruding portion of the cover comprises an inner sidewall defining a space to accommodate the filter.

6. The semiconductor device package according to claim 5, further comprising an adhesive filled in the space defined by the inner sidewall of the protruding portion of the cover.

7. The semiconductor device package according to claim 6, wherein the adhesive comprises conductive fillers selected from carbon black, metal particles, metal-coated particles, or a combination thereof.

8. The semiconductor device package according to claim 5, wherein the inner sidewall of the protruding portion is tilted.

9. The semiconductor device package according to claim 8, wherein the inner sidewall of the protruding portion is tilted at an angle of between about 10° to less than about 90°, relative to the top surface.

10. The semiconductor device package according to claim 8, wherein the inner sidewall of the protruding portion is tilted at an angle of between about 40° to about 50°, relative to the top surface.

11. The semiconductor device package according to claim 1, wherein the tilted inner sidewall is tilted at an angle of between about 10° to about 90°, relative to the top surface.

12. The semiconductor device package according to claim 1, wherein at least one of the bottom surface or the top surface of the cover are light reflection surfaces.

13. The semiconductor device package according to claim 12, wherein the light reflection surfaces are coated with a reflective material.

14. The semiconductor device package according to claim 1, wherein the inner sidewall of the cover further includes a vertical inner sidewall disposed between the top surface and the tilted inner sidewall, and the vertical inner sidewall is connected to the tilted inner sidewall.

15. A semiconductor device package, comprising:
a carrier;
a sensor element for receiving light disposed on the carrier or within the carrier;
a cover comprising a top surface, a bottom surface, an inner sidewall and a protruding portion, the inner sidewall defining a penetrating hole exposing the sensor element, wherein the protruding portion protrudes from the top surface, and the protruding portion includes an inner sidewall defining a space;
a filter disposed in the space and covering the penetrating hole; and
an adhesive disposed in the space, and configured to adhere the filter to the cover and configured to reduce parasitic light from entering the sensor element;
wherein at least a portion of the inner sidewall is tilted, relative to the top surface, and
wherein the cover is a plastic cover and the inner sidewall of the cover is coated with a reflective metal coating.

16. The semiconductor device package according to claim 15, wherein the inner sidewall is divided into an upper portion and a lower portion, the upper portion is substantially perpendicular to the top surface, and the lower portion is tilted at an angle of between about 10° to less than about 90°, relative to the top surface.

17. The semiconductor device package according to claim 15, wherein the inner sidewall of the protruding portion is tilted at an angle of between about 10° to less than about 90°, relative to the top surface.

18. A semiconductor device package, comprising:
a carrier;
a sensor element disposed on or within the carrier; and
a cover comprising a top surface, a bottom surface and an inner sidewall, the inner sidewall defining a penetrating hole extending from the top surface to the bottom surface, and the penetrating hole exposing the sensor element, wherein the inner sidewall consists of an upper portion and a lower portion connected to the upper portion, the upper portion is substantially perpendicular to the top surface, and the lower portion is tilted at an angle of between about 10° to less than about 90°, relative to the top surface,
wherein the cover is a plastic cover and the inner sidewall of the cover is coated with a reflective metal coating.

* * * * *